United States Patent
Pendse et al.

(10) Patent No.: US 8,409,920 B2
(45) Date of Patent: Apr. 2, 2013

(54) INTEGRATED CIRCUIT PACKAGE SYSTEM FOR PACKAGE STACKING AND METHOD OF MANUFACTURE THEREFOR

(75) Inventors: Rajendra D. Pendse, Fremont, CA (US); Flynn Carson, Redwood City, CA (US); Il Kwon Shim, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 461 days.

(21) Appl. No.: 12/057,360

(22) Filed: Mar. 27, 2008

(65) Prior Publication Data
US 2008/0258289 A1 Oct. 23, 2008

Related U.S. Application Data

(60) Provisional application No. 60/913,526, filed on Apr. 23, 2007.

(51) Int. Cl.
*H01L 21/44* (2006.01)

(52) U.S. Cl. ...... 438/109; 257/713; 257/723; 257/738; 257/777; 257/780; 257/E23.069; 257/686; 438/107; 438/110; 438/613

(58) Field of Classification Search ............ 438/107, 438/109, 110, 613; 257/686, 713, 723, 738, 257/777, 780, E23.069
See application file for complete search history.

(56) References Cited

U.S. PATENT DOCUMENTS

| | | | |
|---|---|---|---|
| 5,222,014 A * | 6/1993 | Lin | 361/792 |
| 5,844,315 A | 12/1998 | Melton et al. | |
| 6,762,488 B2 | 7/2004 | Maeda et al. | |
| 6,774,475 B2 | 8/2004 | Blackshear et al. | |
| 6,828,665 B2 | 12/2004 | Pu et al. | |
| 6,861,288 B2 | 3/2005 | Shim et al. | |
| 6,876,074 B2 | 4/2005 | Kim | |
| 6,891,239 B2 | 5/2005 | Anderson et al. | |
| 6,916,683 B2 | 7/2005 | Stephenson et al. | |
| 6,933,176 B1 | 8/2005 | Kirloskar et al. | |
| 6,933,598 B2 | 8/2005 | Karnezos | |
| 7,061,088 B2 | 6/2006 | Karnezos | |
| 7,081,678 B2 | 7/2006 | Liu | |
| 7,176,506 B2 | 2/2007 | Beroz et al. | |
| 7,190,061 B2 | 3/2007 | Lee | |
| 7,279,786 B2 | 10/2007 | Kim | |
| 7,288,835 B2 | 10/2007 | Yim et al. | |
| 7,288,841 B2 | 10/2007 | Yamano | |
| 7,317,247 B2 | 1/2008 | Lee et al. | |
| 7,355,274 B2 | 4/2008 | Lim | |
| 7,364,945 B2 | 4/2008 | Shim et al. | |
| 7,372,151 B1 * | 5/2008 | Fan et al. | 257/738 |
| 7,435,619 B2 | 10/2008 | Shim et al. | |
| 7,528,474 B2 * | 5/2009 | Lee | 257/686 |
| 7,642,133 B2 | 1/2010 | Wu et al. | |
| 7,714,453 B2 * | 5/2010 | Khan et al. | 257/787 |
| 8,013,436 B2 | 9/2011 | Hung et al. | |
| 2004/0058472 A1 | 3/2004 | Shim | |
| 2004/0178499 A1 | 9/2004 | Mistry et al. | |
| 2006/0073635 A1 | 4/2006 | Su et al. | |
| 2006/0175695 A1 | 8/2006 | Lee | |

(Continued)

*Primary Examiner* — Andy Huynh

(74) *Attorney, Agent, or Firm* — Ishimaru & Associates LLP

(57) ABSTRACT

An integrated circuit package system and method of manufacture therefor includes: forming an area array substrate; mounting surface conductors on the area array substrate; forming a molded package body on the area array substrate and the surface conductors; providing a step in the molded package body; and exposing a surface conductor by the step.

10 Claims, 4 Drawing Sheets

U.S. PATENT DOCUMENTS

| | | |
|---|---|---|
| 2006/0180911 A1 | 8/2006 | Jeong et al. |
| 2006/0220209 A1 | 10/2006 | Karnezos et al. |
| 2006/0220210 A1 | 10/2006 | Karnezos et al. |
| 2006/0267175 A1 | 11/2006 | Lee |
| 2006/0284299 A1 | 12/2006 | Karnezos |
| 2007/0141751 A1 | 6/2007 | Mistry et al. |
| 2007/0148822 A1* | 6/2007 | Haba et al. .................... 438/110 |
| 2007/0190690 A1 | 8/2007 | Chow et al. |
| 2007/0216006 A1 | 9/2007 | Park et al. |
| 2007/0278696 A1 | 12/2007 | Lu et al. |
| 2008/0073769 A1 | 3/2008 | Wu et al. |
| 2009/0166834 A1 | 7/2009 | Yoon et al. |

* cited by examiner

INTEGRATED CIRCUIT PACKAGE SYSTEM FOR PACKAGE STACKING AND METHOD OF MANUFACTURE THEREFOR

CROSS-REFERENCE TO RELATED APPLICATION(S)

This application claims the benefit of U.S. Provisional Patent Application Ser. No. 60/913,526 filed Apr. 23, 2007, and the subject matter thereof is hereby incorporated herein by reference thereto.

The present application contains subject matter related to a co-pending U.S. patent application Ser. No. 11/354,806. The related application is assigned to STATS ChipPAC Ltd.

The present application also contains subject matter related to a co-pending U.S. patent application Ser. No. 11/307,615, now U.S. Pat. No. 7,435,619. The related application is assigned to STATS ChipPAC Ltd.

TECHNICAL FIELD

The present invention relates generally to semiconductor packaging, and more particularly to an integrated circuit packaging system for stacking an area array integrated circuit package.

BACKGROUND ART

The electronic industry continues to seek products that are lighter, faster, smaller, multi-functional, more reliable and more cost-effective. In an effort to meet such requirements, package assembly techniques have been developed for multi-chip packages (MCP) and chip stack packages. These types of packages combine two or more semiconductor chips in a single package, thereby realizing increased memory density, multi-functionality and/or reduced package footprint.

The use of several chips in a single package does, however, tend to reduce both reliability and yield. If, during post assembly testing, just one chip in the multi-chip or chip stack package fails to meet the functional or performance specifications, the entire package fails, causing the good chip(s) to be discarded along with the failing chip. As a result, multi-chip and chip stack package may lower the productivity from the assembly process.

A 3-dimensional package stack addresses this yield problem by stacking several assembled packages that each contain a single chip and that have already passed the necessary tests, thereby improving the yield and reliability of the final composite package. However, package stacks have tended to use lead frame type packages rather than area array type packages. Lead frame type packages typically utilize edge-located terminals such as outer leads, whereas area array type packages typically utilize surface-distributed terminals such as solder balls. Area array type package may therefore provide larger terminal counts and/or smaller footprints when compared with corresponding lead frame type packages.

Thus, a need still remains for an integrated circuit package system for package stacking. In view of the rate of development of consumer electronics and the insatiable demand for multi-function devices at low manufacturing costs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming an area array substrate; mounting surface conductors on the area array substrate; forming a molded package body on the area array substrate and the surface conductors; providing a step in the molded package body; and exposing a surface conductor by the step.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
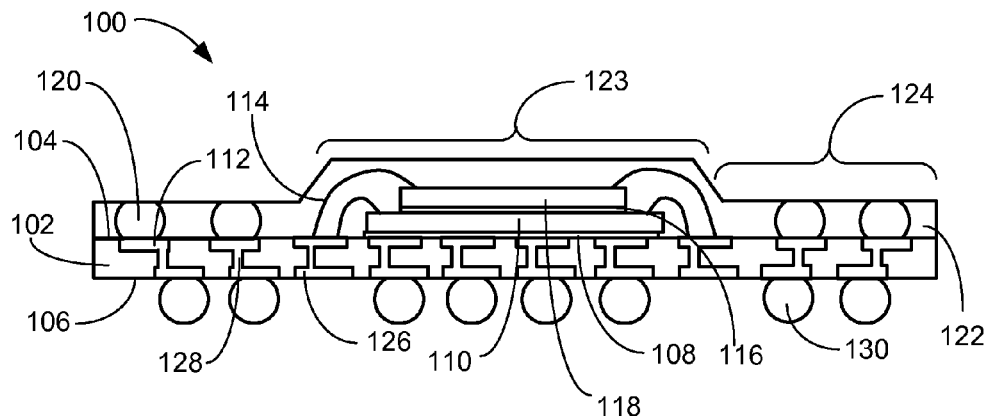
FIG. 1 is a cross-sectional view of an integrated circuit package system for package stacking, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package system 100 for package stacking, in an embodiment of the present invention. The cross-sectional view of the integrated circuit package system 100 depicts an area array substrate 102 having a component side 104 and a system side 106. The area array substrate 102 may be laminate glass epoxy resin, flexible tape, ceramic, inorganic materials, low dielectric materials, semiconductor material, or the like. A first adhesive 108 may be on the component side 104. A first integrated circuit 110 may be positioned on the first adhesive 108 and electrically connected to a contact pad 112 by an electrical interconnect 114.

A second adhesive 116, substantially similar to the first adhesive 108, may be positioned on the active side of the first integrated circuit 110. A second integrated circuit 118 may be mounted on the second adhesive 116. The electrical interconnect 114 may electrically couple the second integrated circuit 118 to the contact pad 112.

A surface conductor 120, such as a solder ball, solder column, solder bump, or stud bump, may be mounted on the contact pad 112. The surface conductor 120 may be made of tin, lead, gold, copper, metal alloy, or other conductive material. The surface conductor 120 may be flattened by coining or pressing prior to molding.

A molded package body 122, having a core section 123, may be formed on the component side 104 of the area array substrate 102, the first integrated circuit 110, the contact pad 112, the electrical interconnects 114, the second integrated circuit 118, and the surface conductor 120. The molded package body 122 is an epoxy molding compound contoured with a step 124 as shown in FIG. 1. The step 124 is a region parallel with the area array substrate 102 and surrounding the core section 123, that provides access to the exposed portion of the surface conductor 120. The top portion of the surface conductor 120 may remain clear of the molding compound by a film assisted molding process whereby a film is applied to the portion of the surface conductor 120 that is to remain exposed. The film may be removed after the molded package body 122 is formed. Other materials or processes may be used to keep the exposed portion of the surface conductor 120 clear, such as a high temperature organic material inserted into a mold. The step 124 can include the characteristics of being formed by a molding process such as having a smooth surface.

The core section 123 may protrude above the step 124 and it encases the first integrated circuit 110, the second integrated circuit 118, and the electrical interconnects 114. The dimensions of the core section 123 may be adjusted to accommodate the electrical interconnects 114 with higher wire loops for die with multiple row bonding pads.

A system contact 126, formed on the system side 106 of the area array substrate 102, may be connected with the contact pad 112 by a via 128. The combination of the contact pad 112, the via 128 and the system contact 126 may provide an electrical path through the area array substrate 102. A system interconnect 130, such as a solder ball, solder column, solder bump, or stud bump, may provide an electrical connection to the next level system (not shown). FIG. 1 depicts all of the contact pads 112 directly coupled to the system contacts 126, but this is by way of an example only. In the actual implementation, there may be an electrical connection formed between the first integrated circuit 110, the second integrated circuit 118, the contact pad 112, the surface conductor 120, the system interconnect 130, or a combination thereof.

It has been discovered that the step 124 may provide useful aspects of the present invention. The molded package body 122 may use less of the epoxy molding compound than current designs. It may also accommodate stacking more integrated circuits while providing a package-on-package platform that may reduce the overall package height of the final product. The protruding portion of the molded package body 122 may act as a stand-off for the upper package during reflow which may prevent the upper package from over-collapsing. The presence of the molded package body 122 in the area of the step 124 may add rigidity to the area array substrate 102 having the surface conductor 120 and help prevent warping of the area array substrate 102 during the manufacturing or assembly processes.

Figure 2:
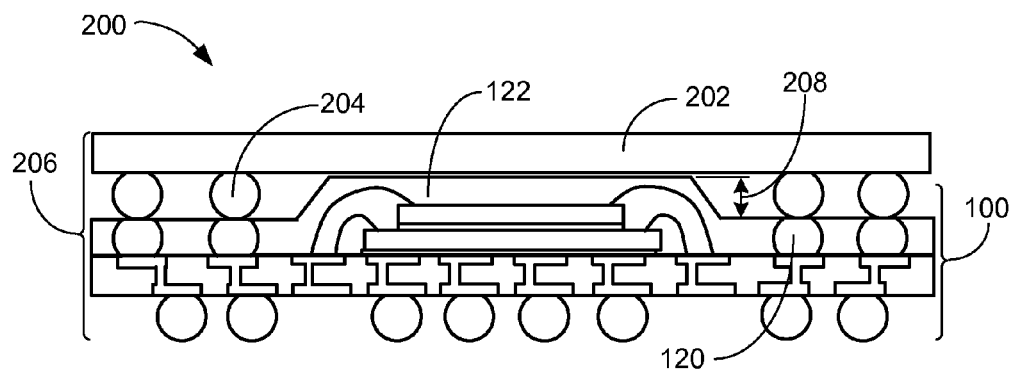
FIG. 2 is a cross-sectional view of an integrated circuit stack using the integrated circuit package system for package stacking of FIG. 1.

Referring now to FIG. 2, therein is shown a cross-sectional view of an integrated circuit stack 200 using the integrated circuit package system 100 for package stacking of FIG. 1. The cross-sectional view of the integrated circuit stack 200 depicts the integrated circuit package system 100 with an area array device 202, such as a flip chip integrated circuit, coupled to the surface conductor 120 by a chip interconnect 204. The chip interconnect 204 may be a solder ball, solder column, solder bump, or stud bump, for electrically connecting the area array device 202 to the integrated circuit package system 100. The integrated circuit stack 200 may have a package height 206 that is smaller than prior art package by a step height 208.

It has been discovered that the molded package body 122 may support the area array device 202 during a reflow process, thus preventing over-collapse of the chip interconnect 204. It is also recognized that the molded package body 122 may act as a solder resist to prevent the chip interconnect 204 from spreading beyond the exposed portion of the surface conductor 120. The size of the step 124 may be controlled in order to allow a smaller diameter of the chip interconnect 204 on the area array device 202. This smaller diameter of the chip interconnect 204 may allow for more of the chip interconnects 204 in a given area.

Figure 3:
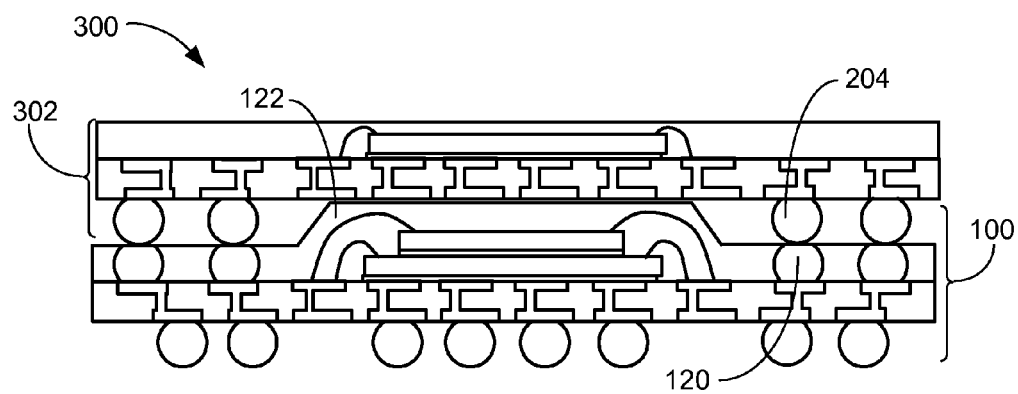
FIG. 3 is a cross-sectional view of a package stack using the integrated circuit package system for package stacking of FIG. 1.

Referring now to FIG. 3, therein is shown a cross-sectional view of a package stack 300 using the integrated circuit package system 100 for package stacking of FIG. 1. The cross-sectional view of the package stack 300 depicts the integrated circuit package system 100 with an area array device 302, such as a ball grid array package, coupled to the surface conductor 120 by the chip interconnect 204. The area array device 302 may be supported by the molded package body 122 during the reflow process of assembly.

The package stack 300 may share all of the aspects of the integrated circuit package system 100 as described above. These aspects may include a reduced height and enhanced manufacturability.

Figure 4:
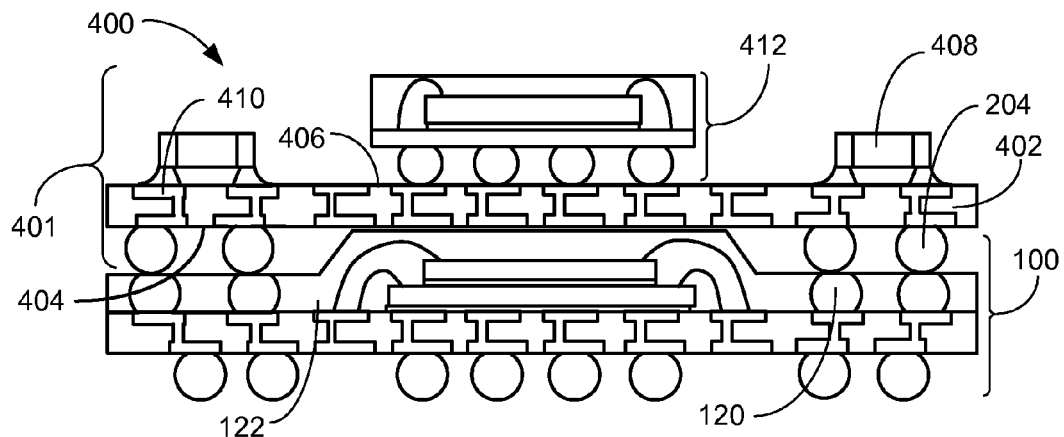
FIG. 4 is a cross-sectional view of an interposer stack using the integrated circuit package system for package stacking of FIG. 1.

Referring now to FIG. 4, therein is shown a cross-sectional view of an interposer stack 400 using the integrated circuit package system 100 for package stacking of FIG. 1. The cross-sectional view of the interposer stack 400 depicts the integrated circuit package system 100 with an area array device 401 including an interposer 402 coupled to the surface conductor 120 by the chip interconnect 204. The interposer 402 may be supported by the molded package body 122 during the reflow process of assembly.

The interposer 402 may have an interposer system side 404 and an interposer component side 406. A discrete component 408, such as a resistor, capacitor, inductor, diode, or the like, may be coupled to an interposer contact 410 on the interposer component side 406 of the interposer 402. An integrated circuit chip 412 may be coupled to the interposer contact 410 as well.

This arrangement may allow a great deal of flexibility in the design of the interposer stack 400. Any of the components mounted on the interposer component side 406 of the interposer 402 may be electrically connected to any component in the integrated circuit package system 100 or the system board (not shown) that may be coupled to the interposer stack 400. Though the integrated circuit chip 412 is shown as a ball grid array device, this is an example only and the integrated circuit chip 412 may be a quad flat no-lead (QFN), a leaded chip carrier (LCC), or another type of packaged component.

Figure 5:
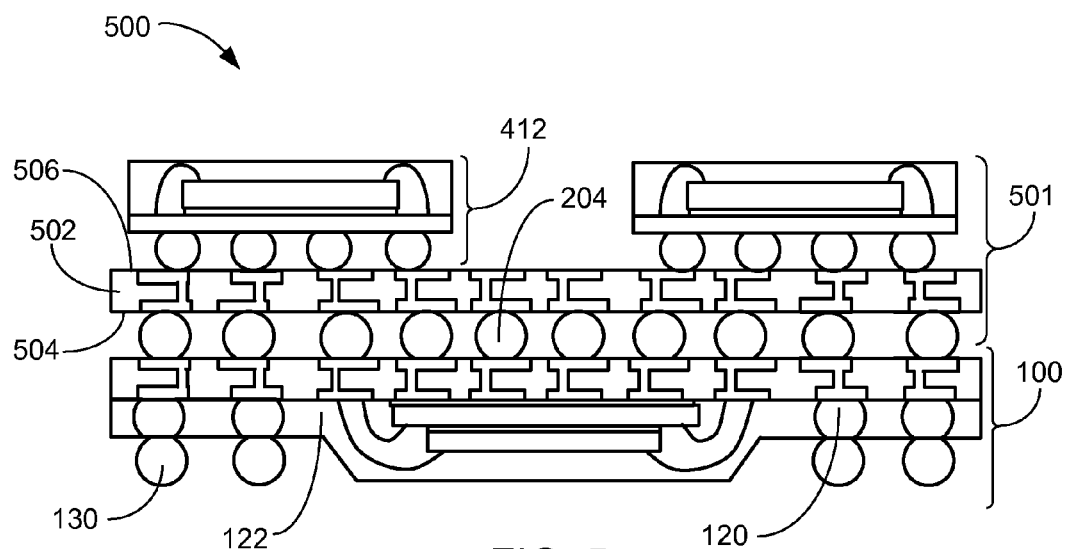
FIG. 5 is a cross-sectional view of an interposer stack in an alternative embodiment using the integrated circuit package system for package stacking of FIG. 1.

Referring now to FIG. 5, therein is shown a cross-sectional view of an interposer stack 500 in an alternative embodiment using the integrated circuit package system 100 for package stacking of FIG. 1. The cross-sectional view of the interposer stack 500 depicts the integrated circuit package system 100, in an inverted position, with the system interconnect 130 coupled to the surface conductor 120. An area array device 501 including an interposer 502 having an interposer system side 504 and an interposer component side 506 may be coupled to the system contact 126 of the area array substrate 102 by the chip interconnect 204.

The interposer 502 may support two or more of the integrated circuit chip 412. In this configuration the height of the interposer stack 500 may be reduced from what is capable by the current practice. It has been discovered that the protrusion of the molded package body 122 may act as a support during the reflow assembly process. The molded package body 122 may prevent the over-collapse of the system interconnect 130 during reflow.

Figure 6:
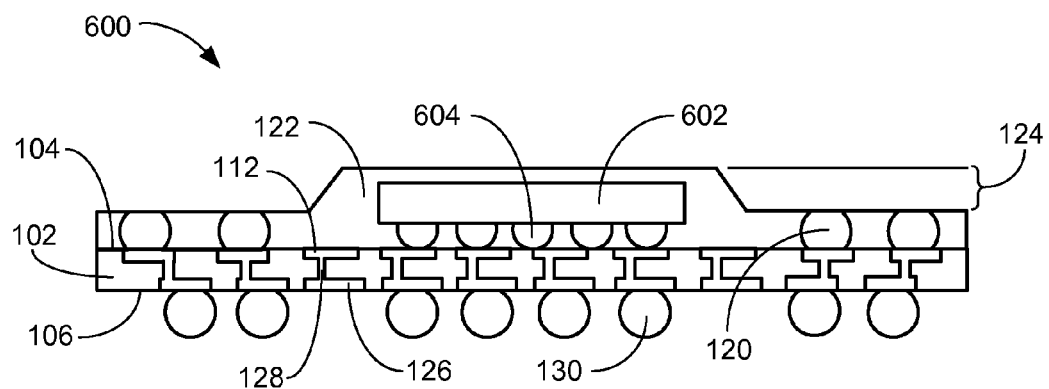
FIG. 6 is a cross-sectional view of an integrated circuit package system for package stacking, in a first alternative embodiment of the present invention.

Referring now to FIG. 6, therein is shown a cross-sectional view of an integrated circuit package system 600 for package stacking, in a first alternative embodiment of the present invention. The cross-sectional view of the integrated circuit package system 600 depicts the area array substrate 102 having the component side 104 and the system side 106. The area array substrate 102 may be laminate glass epoxy resin, flexible tape, ceramic, inorganic materials, low dielectric materials, semiconductor material, or the like. The contact pad 112 may be positioned on the component side 104 of the area array substrate 102. The surface conductor 120 may be coupled to the contact pad 112 in the area of the step 124. A flip chip integrated circuit 602 may be coupled to the contact pad 112 by bumps 604, such as solder bumps, stud bumps, solder balls, or the like.

The contact pad 112 may be coupled to the system contact 126 by the via 128. The system interconnect 130 may be coupled to the system contact 126 on the system side 106 of the area array substrate 102. While FIG. 6 depicts all of the contact pads 112 directly coupled to the system contacts 126, but this is by way of an example only. In the actual implementation, there may be an electrical connection formed between the flip chip integrated circuit 602, the contact pad 112, the surface conductor 120, the system interconnect 130, or a combination thereof.

The molded package body 122 may be formed on the component side 104 of the area array substrate 102, the surface conductor 120, the flip chip integrated circuit 602, and the bumps 604. It has been discovered that by allowing the molded package body to encase the flip chip integrated circuit 602 and the bumps 604, the overall package fatigue life and reliability may be improved.

Figure 7:
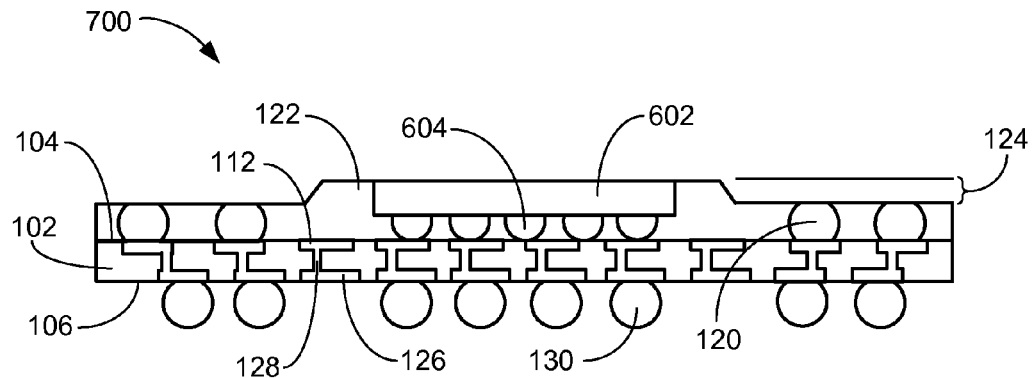
FIG. 7 is a cross-sectional view of an integrated circuit package system for package stacking, in a second alternative embodiment of the present invention.

Referring now to FIG. 7, therein is shown a cross-sectional view of an integrated circuit package system 700 for package stacking, in a second alternative embodiment of the present invention. The cross-sectional view of the integrated circuit package system 700 depicts the area array substrate 102 having the component side 104 and the system side 106. The area array substrate 102 may be laminate glass epoxy resin, flexible tape, ceramic, inorganic materials, low dielectric materials, semiconductor material, or the like. The contact pad 112 may be positioned on the component side 104 of the area array substrate 102. The surface conductor 120 may be coupled to the contact pad 112 in the area of the step 124. The flip chip integrated circuit 602 may be coupled to the contact pad 112 by the bumps 604, such as solder bumps, stud bumps, solder balls, or the like.

The contact pad 112 may be coupled to the system contact 126 by the via 128. The system interconnect 130 may be coupled to the system contact 126 on the system side 106 of the area array substrate 102. While FIG. 6 depicts all of the contact pads 112 directly coupled to the system contacts 126, but this is by way of an example only. In the actual implementation, there may be an electrical connection formed between the flip chip integrated circuit 602, the contact pad 112, the surface conductor 120, the system interconnect 130, or a combination thereof.

The molded package body 122 may be formed on the component side 104 of the area array substrate 102, the surface conductor 120, the flip chip integrated circuit 602, and the bumps 604. In this configuration, the inactive surface of the flip chip integrated circuit 602 may be exposed to the outside of the package. It has been discovered that by allowing the molded package body to encase the flip chip integrated circuit 602 and the bumps 604, the overall package fatigue life and reliability may be improved.

Figure 8:
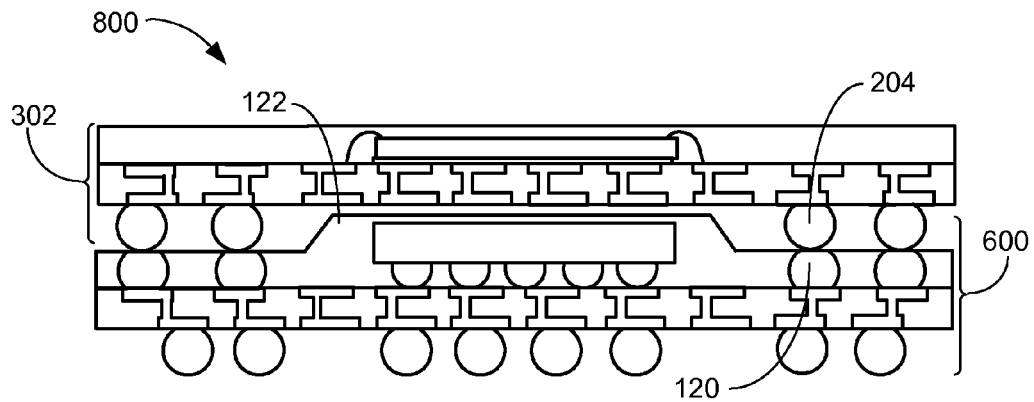
FIG. 8 is a cross-sectional view of a package stack using the integrated circuit package system for package stacking of FIG. 6.

Referring now to FIG. 8, therein is shown a cross-sectional view of a package stack 800 using the integrated circuit package system 600 for package stacking of FIG. 6. The cross-sectional view of the package stack 800 depicts the integrated circuit package system 600 with the area array package 302, such as a ball grid array package, coupled to the surface conductor 120 by the chip interconnect 204. The area array package 302 may be supported by the molded package body 122 during the reflow process of assembly.

The package stack 800 may share all of the aspects of the integrated circuit package system 600 as described above. These aspects may include a reduced height and enhanced manufacturability.

Figure 9:
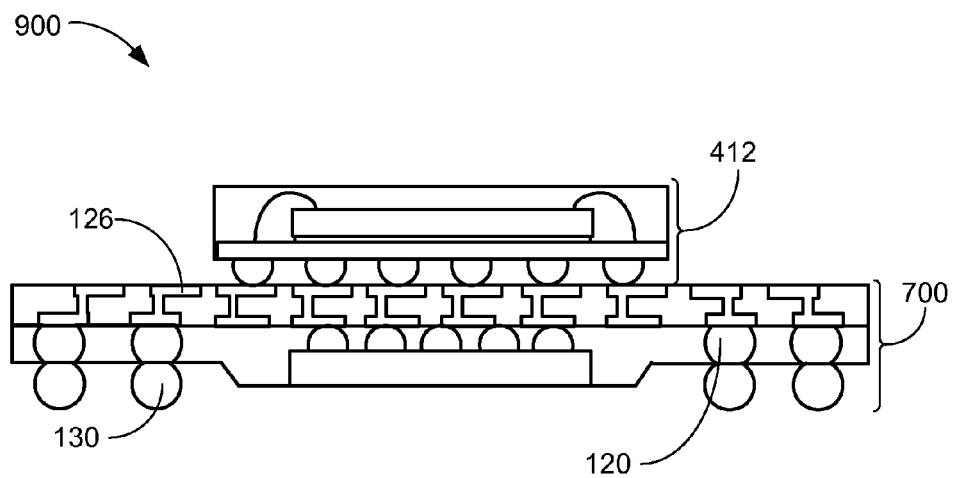
FIG. 9 is a cross-sectional view of a package stack using the integrated circuit package system for package stacking of FIG. 7.

Referring now to FIG. 9, therein is shown a cross-sectional view of a package stack 900 using the integrated circuit package system 700 for package stacking of FIG. 7. The cross-sectional view of the package stack 900 depicts the integrated circuit package system 700, in an inverted position, with the system interconnect 130 coupled to the surface conductor 120.

The integrated circuit chip 412 may be coupled directly to the system contact 126. In this configuration the height of the package stack 900 may be reduced from what is capable by the current practice. It has been discovered that the protrusion of the molded package body 122 may act as a support during the reflow assembly process. The molded package body 122 may prevent the over-collapse of the system interconnect 130 during reflow.

Though the integrated circuit chip 412 is shown as a ball grid array device, this is an example only and the integrated circuit chip 412 may be a quad flat no-lead (QFN), a leaded chip carrier (LCC), or another type of packaged component. This configuration may support multiples of the integrated circuit chip 412 or a combination of the discrete components 408 and the integrated circuit chip 412.

Figure 10:
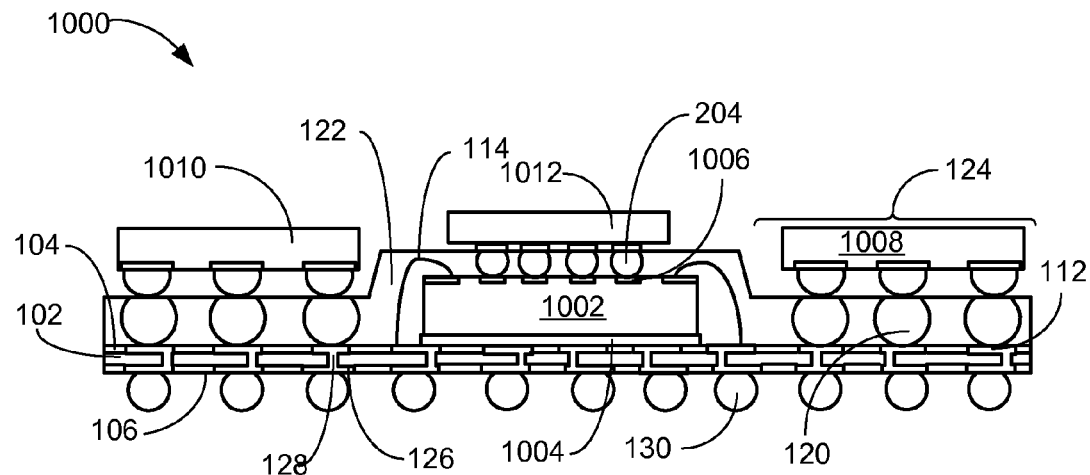
FIG. 10 is a cross-sectional view of an integrated circuit package system for package stacking, in a third alternative embodiment of the present invention.

Referring now to FIG. 10, therein is shown a cross-sectional view of an integrated circuit package system 1000 for package stacking, in a third alternative embodiment of the present invention. The cross-sectional view of the integrated circuit package system 1000 depicts the area array substrate 102 having the component side 104 and the system side 106. The area array substrate 102 may be laminate glass epoxy resin, flexible tape, ceramic, inorganic materials, low dielectric materials, semiconductor material, or the like. The contact pad 112 may be positioned on the component side 104 of the area array substrate 102. The surface conductor 120 may be coupled to the contact pad 112 in the area of the step 124.

An embedded chip 1002, such as a wafer level chip scale package, a redistributed line die, an area array package, or the like, may be mounted on the component side 104 an adhesive 1004. The embedded chip 1002 may be electrically coupled to the contact pad 112 by the electrical interconnect 114. The chip interconnect 204 may be electrically connected to an interconnect pad 1006 on the active surface of the embedded chip 1002.

The molded package body 122 may be formed on the component side 104 of the area array substrate 102, the surface conductor 120, the embedded chip 1002, the electrical interconnect 114, and the chip interconnect 204. The chip interconnect 204 may be partially exposed from the molded package body 122, in a fashion similar to the surface conductor 120. A first area array device 1008, such as ball grid array, flip chip integrated circuit, or the like, may be coupled to the exposed portion of the surface conductor 120 in the area of the step 124.

A second area array device 1010 may be similarly mounted to the surface conductor 120 in another portion of the step 124. A third external chip 1012, such as a flip chip die, a quad flat no-lead package, or the like, may be coupled to the exposed portion of the chip interconnect 204 embedded in the molded package body 122 over the embedded chip 1002.

The contact pad 112 may be coupled to the system contact 126 by the via 128. The system interconnect 130 may be coupled to the system contact 126 on the system side 106 of the area array substrate 102. While FIG. 10 depicts all of the contact pads 112 directly coupled to the system contacts 126, but this is by way of an example only. In the actual implementation, there may be an electrical connection formed between the embedded chip 1002, the first area array device 1008, the second area array device 1010, the third external chip 1012, the contact pad 112, the surface conductor 120, the system interconnect 130, or a combination thereof.

Figure 11:
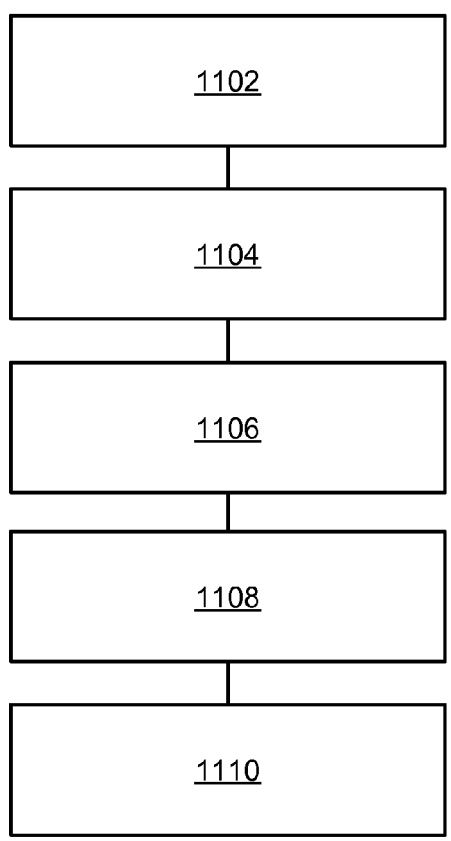
FIG. 11 is a flow chart of a method for manufacturing an integrated circuit package system in an embodiment of the present invention.

Referring now to FIG. 11, therein is shown a flow chart of a method 1100 for manufacturing an integrated circuit package system 100 in an embodiment of the present invention. The method 1100 includes forming an area array substrate in a block 1102; mounting surface conductors on the area array substrate in a block 1104; forming a molded package body on the area array substrate and the surface conductors in a block 1106; providing a step in the molded package body in a block 1108; and exposing a surface conductor by the step in a block 1110.

It has been discovered that the present invention thus has numerous aspects.

An aspect that has been unexpectedly discovered is that the present invention may provide a package-on-package stacking system that can reduce the vertical height of the final package. By increasing the number of functions provided in a smaller space, two main objectives of consumer electronics may be achieved; higher chip density and simplified system board routing.

Another aspect is the integrated circuit package system for package stacking of the present invention may provide additional rigidity to the substrate, making the finished product more reliable and easier to manufacture.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for package-on-package devices providing multiple functions in a minimum of space. The resulting processes and configurations are straightforward, cost-effective, uncomplicated, highly versatile and effective, can be surprisingly and unobviously implemented by adapting known technologies, and are thus readily suited for efficiently and economically manufacturing package-on-package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
  forming an area array substrate;
  mounting surface conductors on the area array substrate;

providing a film or material over portions of the surface conductors;

molding a molded package body with a step surrounding a core section on the area array substrate and the surface conductors such that during the molding step the molded package body does not planarize or come into direct physical contact with the surface conductors, the step for providing access to the surface conductors; and mounting an area array device supported by the core section protruding above the molded package body.

2. The method as claimed in claim 1 wherein mounting the area array device includes coupling the area array device to the surface conductors.

3. The method as claimed in claim 1 wherein molding the molded package body includes:

electrically connecting a first integrated circuit to the area array substrate;

positioning a second integrated circuit over the first integrated circuit; and injecting a molding compound on the substrate, the surface conductors, the first integrated circuit, and the second integrated circuit.

4. The method as claimed in claim 1 wherein mounting the surface conductor includes:

forming contact pads on the area array substrate for mounting the surface conductors;

forming system contacts on the opposing side of the area array substrate; and coupling a via between the contact pad and the system contact.

5. The method as claimed in claim 1 wherein molding the molded package body includes:

forming a core section of the molded package body; and reducing a step height from the core section for forming a region surrounding the core section being parallel to the area array substrate including exposing the surface conductors.

6. A method for manufacturing an integrated circuit package system comprising:

forming an area array substrate having a component side and a system side;

mounting surface conductors on the area array substrate including pressing a solder ball;

providing a film or material over portions of the surface conductors;

molding a molded package body with a step surrounding a core section on the area array substrate and the surface conductors such that during the molding step the molded package body does not planarize or come into direct physical contact with the surface conductors, the step providing access to the surface conductors and reducing a step height from the core section for forming a region surrounding the core section being parallel to the area array substrate; and mounting an area array device supported by the core section protruding above the molded package body.

7. The method as claimed in claim 6 wherein mounting the area array device includes coupling the area array device to the surface conductors including coupling a flip chip integrated circuit, a ball grid array package, or an interposer.

8. The method as claimed in claim 6 wherein molding the molded package body includes:

electrically connecting a first integrated circuit to the area array substrate including coupling an electrical interconnect between the first integrated circuit and the substrate;

positioning a second integrated circuit over the first integrated circuit including applying a second adhesive; and injecting a molding compound on the area array substrate, the surface conductors, the first integrated circuit, the second integrated circuit, and the electrical interconnect.

9. The method as claimed in claim 6 wherein exposing the surface conductor includes:

providing the area array substrate under the molded package body including providing a laminate glass epoxy substrate, a ceramic substrate, or a flexible tape substrate;

mounting a flip chip integrated circuit on the area array substrate including coupling a contact pad to the flip chip integrated circuit;

coupling a via to the contact pad; and coupling a system contact to the via.

10. The method as claimed in claim 6 further comprising:

coupling an embedded chip to the area array substrate;

mounting a chip interconnect to the active side of the embedded chip including coupling a third external chip over the core section; and wherein:

reducing the step height from the core section for exposing the surface conductors includes mounting a first area array device and a second area array device.

* * * * *